Sept. 1, 1970 J. H. SNYDER 3,526,786

CONTROL APPARATUS

Filed Sept. 19, 1967

INVENTOR.
JAMES H. SNYDER

BY Bruce C Lutz

ATTORNEY 3,526,786

CONTROL APPARATUS

James H. Snyder, Battle Creek, Mich., assignor to Honeywell Inc., Minneapolis, Minn., a corporation of Delaware Filed Sept. 19, 1967, Ser. No. 668,910
Int. Cl. G06g 7/16
U.S. Cl. 307—235 7 Claims

ABSTRACT OF THE DISCLOSURE

An absolute amplifier which in one embodiment may be used as a rectifier and in a second embodiment may be used as a multiplier.

The present invention pertains generally to electronic circuits and more specifically to a circuit which may be used either as an absolute amplifier or a multiplier.

When the prior art has disclosed absolute amplifiers, in general they were more complex than the present circuit and often required the use of opposite polarity type transistors. The present invention on the other hand utilizes four transistors of the same polarity type and thus can be designed using tubes or other amplifying devices. Further, the present absolute amplifier can be produced in a form such that it can be used either as a rectifier or as a PWM multiplier wherein the first use merely eliminates the application of signals to two of the terminals.

In operation as an absolute amplifier, the four transistors are connected to form two opposing pairs of differential amplifiers wherein the input signal is applied to the inverting input of one of the pairs and to the noninverting input of the other of the pairs. If a positive signal is applied to the input, one of the differential amplifiers will provide an output signal while internal switching will eliminate the amplifying action of the pair of transistors forming the other differential amplifier. With the opposite polarity input signal, the second differential amplifier will amplify the input signal and will act to prevent operation of the first differential amplifier. As will be explained later, one pair of transistors acting through an output amplifier utilizes a feedback signal to in effect produce a voltage follower while the other pair utilizes negative feedback to obtain a unity gain inverting amplifier.

If the above pairs of differential amplifiers are designed with a diode between the emitters and the common resistor, input signals can be applied between the diodes and the common resistors to switch an individual one of the two pairs of the differential amplifiers to an OFF condition. Thus, a selection can be made as to which of the differential pairs will amplify the input signal. The action of selecting which of the differential pairs will amplify the input signal, deactivates the internal switching which occurs in the absolute amplifier configuration. Thus, if the two switching signals are complementary and if an individual signal has the same positive and negative pulse widths, the output signal will have an average value of zero. However, if the switching signals are pulse width modulated, the output will be representative of the amplitude of the input signal times the modulation of the switching signal. Of course, if the input signal is zero, the output signal will of necessity be zero.

It is therefore an object of this invention to provide either an improved absolute amplifier or a multiplier circuit from substantially the same circuit components.

Further objects and advantages of the present invention over the prior art will be apparent from a reading of the specification and appended claims in conjunction with the drawings wherein:

Figure 1:
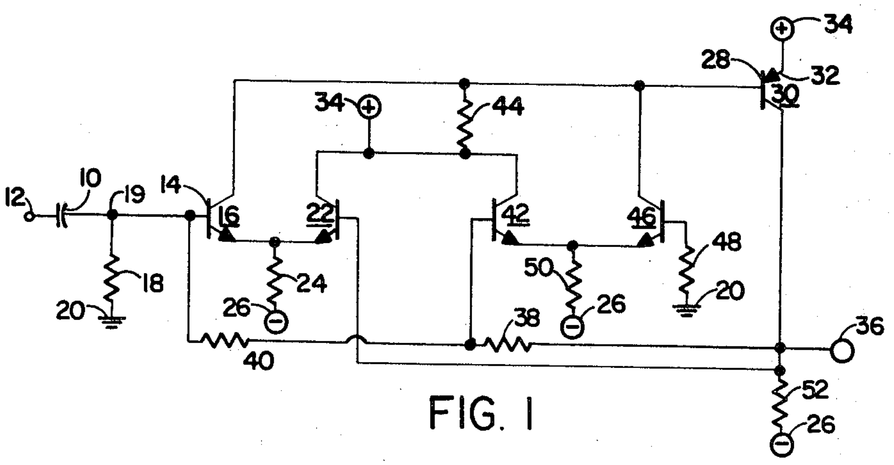
FIG. 1 is a schematic of one embodiment of an absolute amplifier incorporating the teachings of this invention.

Referring now to FIG. 1, a capacitor 10 is connected between an input terminal 12 and a base 14 of an NPN transistor or amplifying means generally designated as 16. A resistor 18 is connected at one end to a junction point 19 between base 14 and capacitor 10 and at the other end to ground or reference potential 20. An emitter of transistor 16 is connected to an emitter of a further NPN transistor or amplifying means 22 and is further connected through a resistor 24 to a source of negative potential 26. A collector of transistor 16 is connected to a base 28 of a PNP transistor or inverting amplifier means generally designated as 30 having an emitter 32 connected to a source of positive potential 34 and a collector connected to an output terminal 36. A pair of resistors 38 and 40 are connected in series between base 14 and output 36 and a junction therebetween is connected to a base of an NPN transistor or amplifying means generally designated as 42 having a collector connected to the collector of transistor 22 and also to positive potential 34. A resistance 44 is connected between potential source 34 and base 28. An emitter of transistor 42 is connected to an emitter of an NPN transistor or amplifying means generally designated as 46 having a collector connected to base 28 and a base connected through a resistor 48 to ground 20. The emitter of transistor 46 is connected through a resistance 50 to negative potential 26. A base of transistor 22 is connected to output terminal 36 and also through a resistor 52 to negative potential 26.

Figure 2:
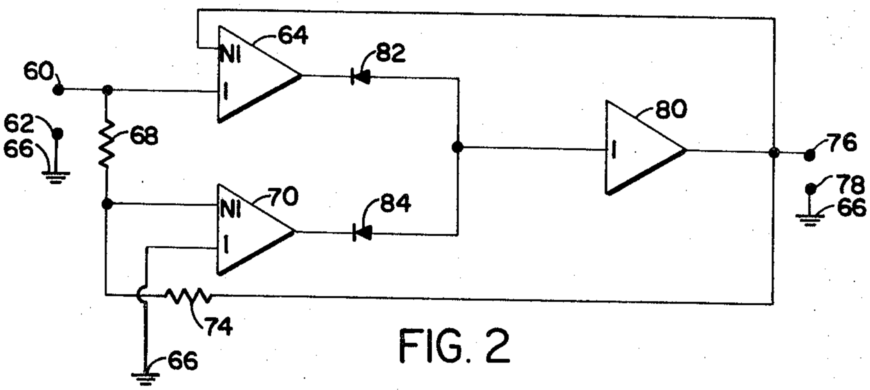
FIG. 2 is a block diagram signifying the action of the circuit of FIG. 1.

In FIG. 2 a pair of input terminals 60 and 62 are connected respectively to an inverting input of a differential amplifier generally designated as 64 and to ground or reference potential 66. Input 60 is also connected through a resistor 68 to a noninverting input of a differential amplifier means generally designated as 70. A noninverting input of amplifier 70 is connected to ground 66. The noninverting input of amplifier 70 is further connected through a feedback resistor 74 to an output terminal 76 which is one of a pair of output terminals the other of which is 78 and is connected to ground 66. Output terminals of amplifiers 64 and 70 are each connected through switches 82 and 84 respectively to an input of an amplifying means generally designated as 80 having an output connected to output terminal 76. The switches 82 and 84 are shown symbolically as diodes and do not actually appear in the invention although the function performed by these diodes occurs. Output terminal 76 is also connected to the noninverting input of amplifier 64. The references to noninverting and inverting inputs of the amplifier 64 and 70 merely refer to the fact that an input signal to an inverting input will be inverted upon reaching the output while an input signal applied to the noninverting input will not be inverted upon reaching the output but may merely be power amplified.

Figure 3:
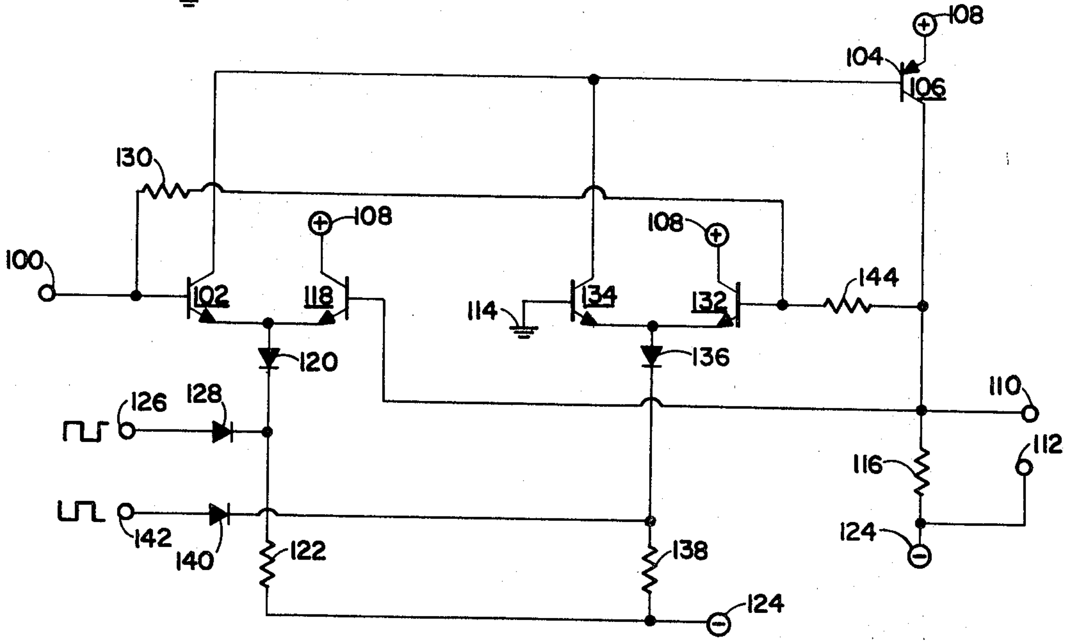
FIG. 3 is a schematic showing the additions necessary to the circuit of FIG. 1 to produce a multiplying circuit.

In FIG. 3 an input terminal 100 is connected directly to a base of an NPN transistor or amplifying means generally designated as 102 having a collector connected to a base 104 of a PNP transistor or amplifying means generally designated as 106. An emitter of transistor 106 is connected to a positive potential 108 while a collector thereof is connected to an output terminal 110. Another output terminal 112 is connected to ground or reference potential 114. A resistor 116 is connected between terminals 110 and 113. An emitter of transistor 102 is connected to an emitter of an NPN transistor or amplifying means 118 which has a collector connected to positive potential 108 and a base connected to output terminal 110. The emitter of transistor 102 is further connected sequentially through a diode 120 and a resistor 122 to a source of negative potential 124. The emitter of transistor 102 is connected to the anode of diode 120 and thus current flows through the diode 120 from anode to cathode in the easy current flow direction. The same designations will be used in further references to diodes in this specification. A switching signal input terminal 126 is connected to an anode of a diode 128 which has its cathode connected to a junction between diode 120 and resistor 122. Resistor 122 is of course the common resistor to the differential amplifier comprising transistors 102 and 118. Input 100 is also connected through a resistor 130 to a base of an NPN transistor or amplifying means generally designated as 132 having a collector connected to positive potential 108 and an emitter connected to an emitter of an NPN transistor or amplifying means generally designated as 134 having a base connected to ground 114 and a collector connected to base 104 of transistor 106. The emitter of transistor 132 is also connected to an anode of a diode 136 which has a cathode connected to one end of a resistor 138 the other end of which is connected to negative potential 124. A diode 140 has an anode connected to a switching signal input terminal 142 while its cathode is connected to the cathode of diode 136. A resistor 144 is connected between the base of transistor 132 and output terminal 110.

OPERATION

Referring first to FIG. 1 it will be assumed that a positive going input signal is applied to terminal 12. While the capacitor 10 is not essential to the operation of the circuit, it is shown since it was used in one embodiment to prevent interference with the bias of transistor 16. The voltage or potential at the base 14 of transistor 16 is the voltage that determines the operation of the circuit. As the voltage at base 14 goes positive with respect to ground potential 20, the base current of transistor 16 increases. This results in an amplified increase in collector and emitter currents for transistor 16. The increase in collector current for transistor 16 causes the base current in transistor 30 to increase thereby producing a large (amplified) increase in current through the collector of transistor 30 and therefore an increase in current through resistor 52. The increase in current through resistor 52 results in an increase in voltage at terminal 36 due to the increased voltage drop across resistor 52. As may be noted, the voltage at terminal 36 is identical to that at the base of transistor 22. When this rising voltage causes the base of transistor 22 to become more positive than base 14, transistor 22 will become forward-biased thereby adding current from the emitter of transistor 22 to that of the emitter of transistor 16. The additional current increases the voltage drop across resistor 24 thereby producing a feedback action which strictly limits the increase in current in transistor 16 to be proportionate to the increase in voltage at base 14. In the above description, transistors 16, 22, and 30 together with resistors 24 and 52 constitute the equivalent of an operational amplifier connected in a circuit known to those skilled in the art as a "voltage follower."

The positive going voltages at base 14 and output 36, acting respectively through resistors 40 and 38 raise the base potential of transistor 42 above ground 20 to which transistor 46 is connected through resistor 48. Resistor 48 is used only to cause a voltage drop essentially equal to that of the base current of transistor 42 through the parallel combination of resistors 40 and 38. Moreover, it is merely part of a biasing technique which limits the gain of the amplifier and is not necessary to the basic operation of the invention.

Current from the emitter of transistor 42 produces a voltage across resistor 50 which causes the emitter current of transistor 46 to be cut off due to the fact that the emitter is raised in potential with respect to the base. Therefore, current from transistor 16 exclusively supplies base current to transistor 30.

As the voltage at base 14 goes negative with respect to ground 20, current is drawn through resistor 40 to the source of input signal. The current decrease in the base of transistor 42 results in a magnified decrease in emitter current in transistor 42 thus tending to reduce the voltage developed across resistor 50 with respect to negative terminal 26. This action, of course, increases the forward bias of transistor 46 and thus produces an increased base current. Through the amplifying action of the transistor, an increased collector current is produced in transistor 46 thereby turning transistor 30 ON to produce a positive going output at terminal 36. The increase in voltage at terminal 36 increases the current through resistor 38 to the base of transistor 32. Thus, negative current feedback is provided to limit the reduction in base current of transistor 42 resulting from a lowering of voltage at junction point 19 due to the input signal. Transistors 42, 46, and 30 along with resistors 40, 38, 50, and 52 constitute the essentials of an operational amplifier connected as a "unity gain inverting amplifier." The positive going voltage at terminal 36 also appears at the base of transistor 22. Since the emitter of transistor 22 follows the base potential, the emitter of transistor 16 is raised in potential with respect to the base 14 and thus turns transistor to an OFF condition. Therefore, base current of the output transistor 30 is exclusively supplied from the collector of transistor 46.

As will be realized from the above description, a novel feature of this invention is the combining of an amplifying means such as output transistor 30 with both a voltage follower and an inverting amplifier so as to provide a circuit in which the output voltage always remains at the same polarity with respect to ground even though bipolar inputs are applied at base 14. The design of the circuit will determine the polarity of the output potentials and in FIG. 1 they are positive. This circuit may be known by different designations to those skilled in the art such as an absolute amplifier or a rectifying amplifier.

Reference to FIG. 2 will show that differential amplifier 64 is representative of the pair of transistors 16 and 22 while differential amplifier 70 is representative of the differential amplifier comprising transistors 42 and 46. Amplifier 80 is representative of amplifier 30. Since the resultant operation of FIG. 2 is exactly the same as FIG. 1, even though the actual operation would not be identical, a description of operation will not be provided. FIG. 2 is merely included to illustrate the principle involved.

If diodes 128 and 140 of FIG. 3 are removed and diodes 120 and 136 are shorted, operation of this circuit is exactly the same as FIG. 1. However, as shown in FIG. 3, it will be noted that if complementary signals are applied at terminals 126 and 142, one of the pairs of differential amplifiers will be switched OFF while the other one is allowed to remain ON. This occurs because of the back biasing of diodes 120 or 136.

As will be remembered from a discussion of FIG. 1, the input signal at terminal 19, depending upon its polarity, would actuate one of transistors 16 and 46 while deactivating the other. This was accomplished by feedback techniques wherein the output signal was used to inactivate one of the transistors 16 and 46 depending upon the polarity of the input signal. In the present embodiment of FIG. 3, however, this feedback inactivation technique is not operative because one of the differential amplifiers is inactivated by the complementary switching signals so that other differential amplifier can operate to produce an output signal which is either positive or negative depending upon the polarity of the input signal.

It may be assumed that a positive steady state signal is applied at terminal 100, and further that the complementary switching signals applied at terminal 126 and 142 have equal time period positive and negative conditions. During the first half cycle of the signal shown as applied to terminal 126, the differential amplifier comprising transistors 102 and 118 is turned OFF. The other pair of transistors 132 and 134, however, remain ON. Thus, the signal at output terminal 110 becomes negative. If the input signal at 100, during the aforementioned half cycle of the complementary switching signal, now becomes negative, the amplifier comprising transistors 132 and 134 will in conjunction with transistor 106 produce a positive output signal.

In the next half cycle of the complementary switching signal applied to terminals 126 and 142, the amplifier including transistors 102 and 118 will be turned ON while the amplifier including transistors 132 and 134 will be turned OFF. A positive signal applied at terminal 100 will now produce a positive signal at output terminal 110 while during this same half cycle a negative signal at terminal 100 will produce a negative signal at terminal 110.

As will be realized, a positive signal at terminal 126 in conjunction with a negative signal at terminal 142 will produce an inverting amplifier action between terminals 100 and 110 while the opposite conditions at terminal 126 and 142 produce a non-inverting amplifier action between terminals 100 and 110.

As will be realized by those skilled in the art the original assumption of equal positive and negative time periods for the complementary switching signals will produce an output signal at terminal 110 which has a zero average. However, if the complementary switching signals are time or pulse width modulated so that the positive time period of a switching signal is different from the negative time period, the average output will change from zero. As will be realized by those skilled in the art the circuit operates in a manner ascribed to a four quadrant multiplier. By arbitrarily defining modulation of the complementary switching signals in one direction as being "positive" and defining modulation in the other direction as being "negative," the circuit will provide a "positive" output with either two positive or two negative "signals" and will produce a "negative" output with one "positive" and one "negative" signal in.

While FIGS. 1 and 3 have been shown as separate circuits providing respectively absolute amplification and multiplication, it is to be realized that the circuit of FIG. 3 can easily be used for either function by merely not using input terminals 126 and 142 or connecting these terminals to the negative potential 124 when it is desired to use the circuit merely as an absolute amplifier.

As will be realized by those skilled in the art the transistor polarities can be reversed if diodes are reversed and the reference potentials are reversed. Further, other amplifying means such as tubes can be substituted for the transistors 102, 118, 132, and 134 and the outputs merely applied to an inverting tube amplifier represented by transistor 106. Thus, while for circuit simplification the transistor 106 is of the opposite polarity type from the rest of the transistors, other transistors of the same polarity type could be utilized to produce a normal inverting amplifier and substitute for transistor 106 if so desired.

In view of the above, I wish to be limited not by the two embodiments shown but only by the scope of the appended claims wherein I claim:

1. Apparatus of the class described, in combination:
first differential amplifying means including first and second input means and output means, the first input means being noninverting with respect to said output means;
second differential amplifying means including first and second input means and output means, the first input means being noninverting with respect to said output means;

means for supplying an input signal connected to said second input means of said first amplifying means and connected to said first input means of said second amplifying means;
apparatus output means connected to receive signals from said output means of said first and second differential amplifying means; and
feedback means connecting said apparatus output means to said first input means of said first differential amplifying means and to said first input means of said second differential amplifier means.

2. Apparatus as claimed in claim 1 for providing absolute amplification wherein said first and second differential amplifying means each includes a pair of semiconductor amplifying means all of the same polarity type and wherein each of said pair of semiconductor means has common emitter means.

3. Apparatus as claimed in claim 1 wherein:
said apparatus includes a reference potential means;
said second input means of each of said differential amplifying means is inverting with respect to said output means thereof; and
said second input means of said second amplifying means is connected to said reference potential means.

4. Apparatus as claimed in claim 3 for providing absolute amplification wherein said apparatus output means includes output amplifying means for providing unipolar signals indicative in absolute amplitude of bipolar input signals supplied to said differential amplifying means.

5. A multiplying circuit comprising, in combination:
a controlled signal inverting amplifier means and a controlled signal non-inverting amplifier means each having an input means and an output means, said controlled amplifier means each including a pair of amplifying means connected at a common point in a differential amplifying configuration and diode means connected in series with an impedance common to each of said pairs of amplifying means;
means for supplying a multiplicand signal to said input means of said first and said second amplifier means;
means for supplying pulse width modulated switching multiplier signal to said diode means for alternately activating and deactivating said inverting amplifier means while simultaneously alternately deactivating and activating said non-inverting amplifier means; and
apparatus output means connected to said output means of said controlled amplifier means for receiving signals therefrom indicative of the amplitude and polarity of added multiplicand signal times the modulation of said multiplier signal.

6. Apparatus as claimed in claim 5 wherein feedback means is connected between said apparatus output means and one of each of said pair of amplifying means connected in a differential amplifying configuration which produces a noninverting output.

7. Apparatus as claimed in claim 5, wherein said inverting amplifier means includes a non-inverting input means; and feedback means are connected from said apparatus output means to the non-inverting input means of said controlled amplifier means.

References Cited

UNITED STATES PATENTS

| | | | |
|---|---|---|---|
| 3,432,650 | 3/1969 | Thompson | 328—160 |

DONALD D. FORRER, Primary Examiner

J. D. FREW, Assistant Examiner

U.S. Cl. X.R.

235—196; 307—237; 328—160; 330—30, 69